United States Patent
Uemichi

(10) Patent No.: US 12,015,387 B2
(45) Date of Patent: Jun. 18, 2024

(54) DIGITAL PHASE SHIFTER

(71) Applicant: Fujikura Ltd., Tokyo (JP)

(72) Inventor: Yusuke Uemichi, Sakura (JP)

(73) Assignee: FUJIKURA LTD., Tokyo (JP)

( * ) Notice: Subject to any disclaimer, the term of this patent is extended or adjusted under 35 U.S.C. 154(b) by 16 days.

(21) Appl. No.: 18/101,623

(22) Filed: Jan. 26, 2023

(65) Prior Publication Data

US 2023/0421138 A1 Dec. 28, 2023

(30) Foreign Application Priority Data

Jun. 27, 2022 (JP) ................. 2022-102955

(51) Int. Cl.
*H03H 17/08* (2006.01)
*H03H 11/16* (2006.01)

(52) U.S. Cl.
CPC ............ *H03H 17/08* (2013.01); *H03H 11/16* (2013.01)

(58) Field of Classification Search
CPC ........ H03H 17/08; H03H 11/16; H03K 5/131; H03K 5/133; H03K 2005/00286
USPC ................ 327/231, 261, 268, 290, 295, 296
See application file for complete search history.

(56) References Cited

U.S. PATENT DOCUMENTS 11,689,189 B2 * 6/2023 Heuttner ............... H01P 3/08
327/231

FOREIGN PATENT DOCUMENTS

| JP | 2013-098744 A | 5/2013 |
| JP | 2021-013071 A | 2/2021 |
| JP | 7076658 B1 | 5/2022 |
| JP | 7076663 B1 | 5/2022 |

OTHER PUBLICATIONS

Tousi et al., "A Ka-band Digitally-Controlled Phase Shifter with sub-degree Phase Precision", 2016 IEEE Radio Frequency Integrated Circuits Symposium, pp. 356-359, cited in Specification. (4 pages).

* cited by examiner

*Primary Examiner* — Hai L Nguyen
(74) *Attorney, Agent, or Firm* — WHDA, LLP

(57) ABSTRACT

A digital phase shifter includes a plurality of digital phase shift circuit groups in which a plurality of digital phase shift circuits are connected in cascade and one or more bend-type connection units connected between two digital phase shift circuit groups. At least one of the digital phase shift circuits constituting at least one digital phase circuit group is a mitigation circuit that mitigates a distribution of phase shift amounts.

10 Claims, 12 Drawing Sheets

DIGITAL PHASE SHIFTER

CROSS-REFERENCE TO RELATED APPLICATION

Priority is claimed on Japanese Patent Application No. 2022-102955, filed Jun. 27, 2022, the content of which is incorporated herein by reference.

BACKGROUND OF THE INVENTION

Field of the Invention

The present invention relates to a digital phase shifter.

Description of Related Art

In "A Ka-band digitally-controlled phase shifter with sub-degree phase precision" (2016, Institute of Electrical and Electronics Engineers (IEEE), Radio Frequency Integrated Circuits (RFIC) Symposium), a digitally-controlled phase shifter for high-frequency signals such as microwaves, quasi-millimeter waves, or millimeter waves (a digital phase shift circuit) is disclosed. A large number of digital phase shift circuits are actually mounted on a semiconductor substrate in a state in which the digital phase shift circuits are connected in cascade. That is, the digital phase shift circuit is a unitary unit in the configuration of an actual digital phase shifter and a desired function is exhibited by connecting several tens of digital phase shift circuits in cascade.

SUMMARY OF THE INVENTION

When the configuration of the digital phase shifter is a configuration in which the above digital phase shift circuits are connected in a line, the length of the digital phase shifter increases. In order to shorten the length of the digital phase shifter, a configuration in which the configuration of the digital phase shifter is bent using a connection unit such as a bend-type line having a bent structure is conceivable.

SUMMARY OF THE INVENTION

Meanwhile, in a digital phase shifter with a configuration in which a large number of digital phase shift circuits are connected in cascade, it is desirable to eliminate a distribution of phase shift amounts. However, a distribution of phase shift amounts is also caused by weak reflections occurring in front of and behind a connection unit in a situation in which suitable input-output impedance matching is achieved in the above-described digital phase shifter configured to be bent using a connection unit such as a bend-type line.

The present invention has been made in view of the above-described circumstances and an objective of the present invention is to provide a digital phase shifter capable of mitigating a distribution of phase shift amounts caused by weak reflections occurring in front of and behind a connection unit.

According to a first aspect of the present invention, there is provided a digital phase shifter including: a plurality of digital phase shift circuit groups in which a plurality of digital phase shift circuits are connected in cascade; and one or more bend-type connection units connected between two digital phase shift circuit groups, wherein each of the digital phase shift circuits includes at least a signal line, a pair of inner lines provided at both sides of the signal line, a pair of outer lines provided outside of the inner lines, a first ground conductor connected to one end of each of the inner lines and the outer lines, a second ground conductor connected to the other end of each of the outer lines, a pair of electronic switches provided between the other ends of the inner lines and the second ground conductor, and a capacitor electrically connected between the signal line and at least one of the first ground conductor and the second ground conductor, wherein each of the digital phase shift circuits is a circuit set in a low-delay mode in which a return current flows through the inner line or a high-delay mode in which a return current flows through the outer line, and wherein at least one of the digital phase shift circuits constituting at least one digital phase shift circuit group is a mitigation circuit configured to mitigate a distribution of phase shift amounts.

In the digital phase shifter according to the first aspect of the present invention, at least one of the digital phase shift circuits constituting at least one digital phase shift circuit group connected via the connection unit is the mitigation circuit that mitigates the distribution of phase shift amounts. Thereby, it is possible to mitigate the distribution of phase shift amounts caused by weak reflections occurring in front of and behind the connection unit.

According to a second aspect of the present invention, in the digital phase shifter according to the first aspect of the present invention, the mitigation circuit may include at least one of: a first mitigation circuit that is the digital phase shift circuit having a larger phase shift amount than the digital phase shift circuit other than the mitigation circuit and that is configured to mitigate a recess portion in the distribution of phase shift amounts; and a second mitigation circuit that is the digital phase shift circuit having a smaller phase shift amount than the digital phase shift circuit other than the mitigation circuit and that is configured to mitigate a projection portion in the distribution of phase shift amounts.

Also, according to a third aspect of the present invention, in the digital phase shifter according to the second aspect of the present invention, at least one of the digital phase shift circuits constituting at least one digital phase shift circuit group having both ends connected to the connection unit may be the first mitigation circuit.

Also, according to a fourth aspect of the present invention, in the digital phase shifter according to the second or third aspect of the present invention, a control of whether to set the mode as the low-delay mode or the high-delay mode in the digital phase shift circuit may be started from the digital phase shift circuit which is located at a side in which the capacitor is provided between two digital phase shift circuits located at an outermost side and may be sequentially performed in a connection order of the digital phase shift circuits.

Also, according to a fifth aspect of the present invention, in the digital phase shifter according to the fourth aspect of the present invention, at least one digital phase shift circuit located behind at least one connection unit in a direction in which the digital phase shift circuit is controlled may be the first mitigation circuit.

Also, according to a sixth aspect of the present invention, in the digital phase shifter according to the fourth aspect of the present invention, at least one digital phase shift circuit located in front of at least one connection unit in a direction in which the digital phase shift circuit is controlled may be the second mitigation circuit.

Also, according to a seventh aspect of the present invention, in the digital phase shifter according to any one of the second to sixth aspects of the present invention, the first mitigation circuit may satisfy at least one of a condition that a length of the first mitigation circuit is longer than that of the digital phase shift circuit other than the mitigation circuit, a condition that a distance between the signal line and the inner line in the first mitigation circuit is shorter than that in the digital phase shift circuit other than the mitigation circuit, a condition that a distance between the signal line and the outer line in the first mitigation circuit is longer than that in the digital phase shift circuit other than the mitigation circuit, a condition that the capacitor of the first mitigation circuit is larger than that of the digital phase shift circuit other than the mitigation circuit, and a condition that the pair of electronic switches of the first mitigation circuit are larger than those of the digital phase shift circuit other than the mitigation circuit, and the second mitigation circuit satisfies at least one of a condition that a length of the second mitigation circuit is shorter than that of the digital phase shift circuit other than the mitigation circuit, a condition that a distance between the signal line and the inner line in the second mitigation circuit is longer than that in the digital phase shift circuit other than the mitigation circuit, a condition that a distance between the signal line and the outer line in the second mitigation circuit is shorter than that in the digital phase shift circuit other than the mitigation circuit, a condition that the capacitor of the second mitigation circuit is smaller than that of the digital phase shift circuit other than the mitigation circuit, and a condition that the pair of electronic switches of the second mitigation circuit are smaller than those of the digital phase shift circuit other than the mitigation circuit.

Also, according to an eighth aspect of the present invention, in the digital phase shifter according to any one of the first to seventh aspects of the present invention, the digital phase shift circuit may include an electronic switch configured to switch between whether or not to connect the capacitor between the signal line and at least one of the first ground conductor and the second ground conductor.

Also, according to a ninth aspect of the present invention, in the digital phase shifter according to any one of the first to eighth aspects of the present invention, the connection unit may include: a first connection line configured to connect the signal lines of the digital phase shift circuits located at ends of two digital phase shift circuit groups; a second connection line configured to connect the inner lines of the digital phase shift circuits located at ends of two digital phase shift circuit groups; a ground layer arranged in at least one of an upward direction and a downward direction of the first connection line and the second connection line; and a via-hole configured to connect at least the second connection line and the ground layer.

Also, according to a tenth aspect of the present invention, in the digital phase shifter according to the ninth aspect of the present invention, the connection unit may include a third connection line configured to connect the outer lines of the digital phase shift circuits located at outermost ends of two digital phase shift circuit groups.

According to the present invention, it is possible to mitigate a distribution of phase shift amounts caused by weak reflections occurring in front of and behind a connection unit.

PREFERRED EMBODIMENTS

Figure 1:
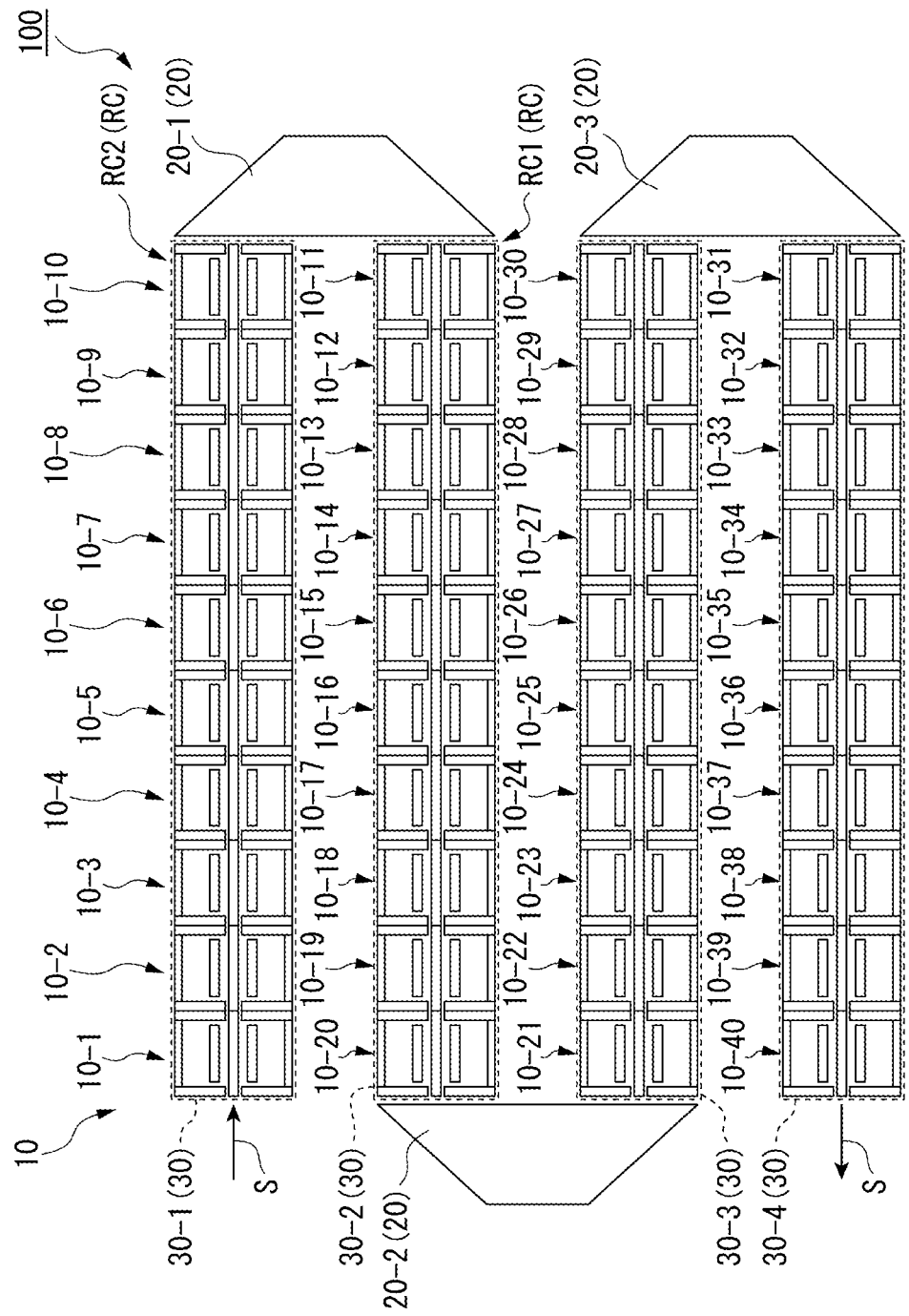
FIG. 1 is a plan view showing a schematic configuration of a digital phase shifter according to an embodiment of the present invention.

Hereinafter, a digital phase shifter according to an embodiment of the present invention will be described in detail with reference to the drawings. In the drawings referred to below, the dimensions of each member are appropriately changed as necessary and illustrated to facilitate understanding.

<Digital Phase Shifter>

FIG. 1 is a plan view showing a schematic configuration of a digital phase shifter according to an embodiment of the present invention. As shown in FIG. 1, a digital phase shifter 100 of the present embodiment includes a plurality of digital phase shift circuits 10 (10-1 to 10-40) and a plurality of connection units 20 (20-1 to 20-3). In this digital phase shifter 100, the plurality of digital phase shift circuits 10 connected in cascade perform a phase shift process for a signal S having a predetermined frequency band. The signal S is a high-frequency signal having a frequency band of microwaves, quasi-millimeter waves, millimeter waves, or the like.

The plurality of digital phase shift circuits 10 are electrically connected in cascade. Although an example in which 40 digital phase shift circuits 10 (10-1 to 10-40) are connected in cascade is shown in FIG. 1, the number of digital phase shift circuits 10 connected in cascade is arbitrary. In the example shown in FIG. 1, for convenience of description, the 40 digital phase shift circuits 10 connected in cascade are referred to as the digital phase shift circuits 10-1, 10-2, ..., and 10-40 in the order in which the signal S flows. However, a direction in which the signal S flows may be reversed.

Here, the digital phase shift circuits 10 constitute a digital phase shift circuit group 30 in units of a plurality of digital phase shift circuits 10. Specifically, the $1^{st}$ to $10^{th}$ digital phase shift circuits 10-1 to 10-10 constitute a digital phase shift circuit group 30-1 and the $11^{th}$ to $20^{th}$ digital phase shift circuits 10-11 to 10-20 constitute a digital phase shift circuit group 30-2. The $21^{st}$ to $30^{th}$ digital phase shift circuits 10-21 to 10-30 constitute a digital phase shift circuit group 30-3 and the 31$^{st}$ to 40$^{th}$ digital phase shift circuits 10-31 to 10-40 constitute a digital phase shift circuit group 30-4.

In other words, the digital phase shifter 100 includes the digital phase shift circuit group 30-1 in which the plurality of digital phase shift circuits 10-1 to 10-10 are connected in cascade and the digital phase shift circuit group 30-2 in which the plurality of digital phase shift circuits 10-11 to 10-20 are connected in cascade. Also, the digital phase shifter 100 includes the digital phase shift circuit group 30-3 in which the plurality of digital phase shift circuits 10-21 to 10-30 are connected in cascade and the digital phase shift circuit group 30-4 in which the plurality of digital phase shift circuits 10-31 to 10-40 are connected in cascade.

Here, in the present embodiment, at least one of the digital phase shift circuits to 10-40 is a mitigation circuit RC that mitigates a distribution of phase shift amounts caused by weak reflections occurring in front of and behind the connection unit 20. Mitigation circuits RC include a first mitigation circuit RC1 and a second mitigation circuit RC2. The first mitigation circuit RC1 is a digital phase shift circuit having a larger phase shift amount than the digital phase shift circuits 10 other than the mitigation circuit RC (the first mitigation circuit RC1 and the second mitigation circuit RC2). The first mitigation circuit RC1 is a circuit configured to mitigate a recess portion in the above-described distribution of phase shift amounts (see FIGS. 10A to 10C). The second mitigation circuit RC2 is a digital phase shift circuit 10 having a smaller phase shift amount than the digital phase shift circuits 10 other than the mitigation circuit RC (the first mitigation circuit RC1 and the second mitigation circuit RC2). The second mitigation circuit RC2 is a circuit configured to mitigate a projection portion in the above-described distribution of phase shift amounts (see FIGS. 10A to 10C).

In FIG. 1, an example in which the digital phase shift circuits 10-10 and 10-11 are used as the mitigation circuit RC is shown. For example, the digital phase shift circuit 10-10 is referred to as the second mitigation circuit RC2 and the digital phase shift circuit 10-11 is referred to as the first mitigation circuit RC1. In addition, details of the specific configuration of the mitigation circuit RC (the first mitigation circuit RC1 and the second mitigation circuit RC2) and which of the digital phase shift circuits 10 is the mitigation circuit RC will be described below.

The connection unit 20 has a bend-type shape and connects two digital phase shift circuit groups 30. In the example shown in FIG. 1, the connection unit 20 has a shape of a 180° bend. Specifically, the connection unit 20-1 connects the other end of the digital phase shift circuit group 30-1 to one end of the digital phase shift circuit group 30-2. The other end of the digital phase shift circuit group 30-1 is opposed to one end to which the signal S of the digital phase shift circuit group 30-1 is input. The connection unit 20-2 connects the other end of the digital phase shift circuit group 30-2 and one end of the digital phase shift circuit group 30-3. The connection unit 20-3 connects the other end of the digital phase shift circuit group 30-3 and one end of the digital phase shift circuit group 30-4.

That is, the connection unit 20-1 connects the digital phase shift circuit 10-10 of the digital phase shift circuit group 30-1 to the digital phase shift circuit 10-11 of the digital phase shift circuit group 30-2. The connection unit 20-2 connects the digital phase shift circuit 10-20 of the digital phase shift circuit group 30-2 to the digital phase shift circuit 10-21 of the digital phase shift circuit group 30-3. The connection unit 20-3 connects the digital phase shift circuit 10-30 of the digital phase shift circuit group 30-3 to the digital phase shift circuit 10-31 of the digital phase shift circuit group 30-4.

When the digital phase shift circuit group 30-1 and the digital phase shift circuit group 30-2 are connected by the connection unit 20-1, the path of the signal S is bent 180°. Also, when the digital phase shift circuit group 30-2 and the digital phase shift circuit group 30-3 are connected by the connection unit 20-2, the path of the signal S is bent 180°. Likewise, when the digital phase shift circuit group 30-3 and the digital phase shift circuit group 30-4 are connected by the connection unit 20-3, the path of the signal S is bent 180°. Thus, the digital phase shift circuit groups 30-1 to 30-4 are arranged in parallel to each other and are connected in a meander shape via the connection units 20-1 to 20-3. In addition, details of the connection unit 20 will be described below <Digital Phase Shift Circuit>

Figure 2:
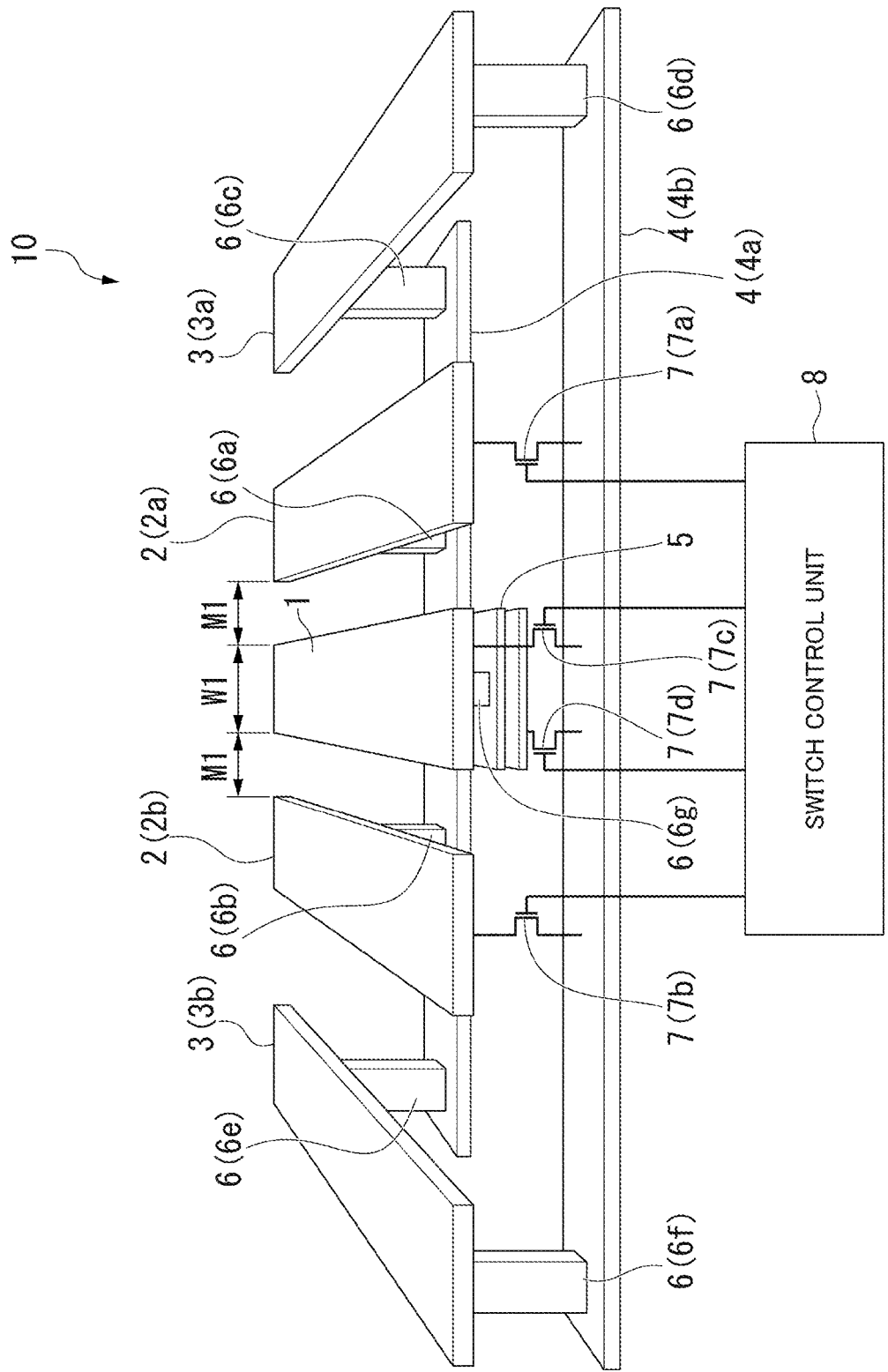
FIG. 2 is a perspective view showing a configuration of a digital phase shift circuit according to the embodiment of the present invention.

FIG. 2 is a perspective view showing a configuration of the digital phase shift circuit according to the embodiment of the present invention. As shown in FIG. 2, the digital phase shift circuit 10 includes a signal line 1, a pair of inner lines 2 (a first inner line 2a and a second inner line 2b), a pair of outer lines 3 (a first outer line 3a and a second outer line 3b), a pair of ground conductors 4 (a first ground conductor 4a and a second ground conductor 4b), a capacitor 5, a plurality of connection conductors 6, four electronic switches 7 (a first electronic switch 7a, a second electronic switch 7b, a third electronic switch 7c, and a fourth electronic switch 7d), and a switch control unit 8.

The signal line 1 is a linear strip-shaped conductor extending in a predetermined direction. That is, the signal line 1 is a long plate-shaped conductor having a certain width W1, a certain thickness, and a predetermined length. In the example shown in FIG. 2, the signal S flows through the signal line 1 in a direction from the front side to the back side.

The first inner line 2a is a linear strip-shaped conductor. That is, the first inner line 2a is a long plate-shaped conductor having a certain width, a certain thickness, and a predetermined length. The first inner line 2a extends in a direction that is the same as the extension direction of the signal line 1. The first inner line 2a is provided parallel to the signal line 1 and is separated from one side of the signal line 1 (the right side in FIG. 2) by a predetermined distance M1.

The second inner line 2b is a linear strip-shaped conductor. That is, the second inner line 2b is a long plate-shaped conductor having a certain width, a certain thickness, and a predetermined length like the first inner line 2a. The second inner line 2b extends in a direction that is the same as the extension direction of the signal line 1. The second inner line 2b is provided parallel to the signal line 1 and is separated from the other side of the signal line 1 (the left side in FIG. 2) by the predetermined distance M1.

The first outer line 3a is a linear strip-shaped conductor provided at a position farther from the signal line 1 than the first inner line 2a at the one side of the signal line 1. The first outer line 3a is a long plate-shaped conductor having a certain width, a certain thickness, and a predetermined length. The first outer line 3a is provided parallel to the signal line 1 at an interval of a predetermined distance from the signal line 1 in a state in which the first inner line 2a is sandwiched between the signal line 1 and the first outer line 3a. The first outer line 3a extends in a direction that is the same as the extension direction of the signal line 1 like the first inner line 2a and the second inner line 2b.

The second outer line 3b is a linear strip-shaped conductor provided at a position farther from the signal line 1 than the second inner line 2b at the other side of the signal line 1. The second outer line 3b is a long plate-shaped conductor having a certain width, a certain thickness, and a predetermined length like the first outer line 3a. The second outer line 3b is provided in parallel at an interval of a predetermined distance from the signal line 1 in a state in which the second inner line 2b is sandwiched between the second outer line 3b and the signal line 1. The second outer line 3b extends in a direction that is the same as the extension direction of the signal line 1 like the first inner line 2a and the second inner line 2b.

The first ground conductor 4a is a linear strip-shaped conductor provided at one end side of each of the first inner line 2a, the second inner line 2b, the first outer line 3a, and the second outer line 3b. The first ground conductor 4a is electrically connected to one end of each of the first inner line 2a, the second inner line 2b, the first outer line 3a, and the second outer line 3b. The first ground conductor 4a is a long plate-shaped conductor having a certain width, a certain thickness, and a predetermined length.

The first ground conductor 4a is provided orthogonal to the first inner line 2a, the second inner line 2b, the first outer line 3a, and the second outer line 3b extending in the same direction. The first ground conductor 4a is provided below the first inner line 2a, the second inner line 2b, the first outer line 3a, and the second outer line 3b at an interval of a predeteimined distance therefrom.

The first ground conductor 4a is set so that one end (a right end in FIG. 2) in the left and right directions has substantially the same position as the right edge of the first outer line 3a. Also, the first ground conductor 4a is set so that the other end (a left end in FIG. 2) in the left and right directions has substantially the same position as the left edge of the second outer line 3b.

The second ground conductor 4b is a linear strip-shaped conductor provided at the other end side of each of the first inner line 2a, the second inner line 2b, the first outer line 3a, and the second outer line 3b. The second ground conductor 4b is a long plate-shaped conductor having a certain width, a certain thickness, and a predetermined length like the first ground conductor 4a.

The second ground conductor 4b is arranged parallel to the first ground conductor 4a and is provided orthogonal to the first inner line 2a, the second inner line 2b, the first outer line 3a, and the second outer line 3b like the first ground conductor 4a. The second ground conductor 4b is provided below the first inner line 2a, the second inner line 2b, the first outer line 3a, and the second outer line 3b at an interval of a predetermined distance therefrom.

The second ground conductor 4b is set so that one end (the right end in FIG. 2) in the left and right directions has substantially the same position as the right edge of the first outer line 3a. Also, the second ground conductor 4b is set so that the other end (the left end in FIG. 2) in the left and right directions has substantially the same position as the left edge of the second outer line 3b. That is, the second ground conductor 4b has the same position as the first ground conductor 4a in the left and right directions.

The capacitor 5 is provided between the other end of the signal line 1 and the second ground conductor 4b. For example, the capacitor 5 has an upper electrode electrically connected to the signal line 1 and a lower electrode electrically connected to the fourth electronic switch 7d. For example, the capacitor 5 is a thin film capacitor having a metal insulator metal (MIM) structure. In addition, the capacitor 5 has capacitance Ca corresponding to an opposite area of the parallel plate. Here, instead of a parallel flat capacitor, a comb tooth type capacitor may be used as the capacitor 5.

The plurality of connection conductors 6 include at least the connection conductors 6a to 6f. The connection conductor 6a is a conductor that electrically and mechanically connects one end of the first inner line 2a and the first ground conductor 4a. For example, the connection conductor 6a is a conductor extending in the up and down direction and has one end (an upper end) connected to the lower surface of the first inner line 2a and the other end (a lower end) connected to the upper surface of the first ground conductor 4a.

The connection conductor 6b is a conductor that electrically and mechanically connects one end of the second inner line 2b and the first ground conductor 4a. For example, the connection conductor 6b is a conductor extending in the up and down direction like the connection conductor 6a. The connection conductor 6b has one end (an upper end) connected to the lower surface of the second inner line 2b and the other end (a lower end) connected to the upper surface of the first ground conductor 4a.

The connection conductor 6c is a conductor that electrically and mechanically connects one end of the first outer line 3a and the first ground conductor 4a. For example, the connection conductor 6c is a conductor extending in the up and down direction. The connection conductor 6c has one end (an upper end) connected to the lower surface at one end of the first outer line 3a and the other end (a lower end) connected to the upper surface of the first ground conductor 4a.

The connection conductor 6d is a conductor that electrically and mechanically connects the other end of the first outer line 3a and the second ground conductor 4b. For example, the connection conductor 6d is a conductor extending in the up and down direction. The connection conductor 6d has one end (an upper end) connected to the lower surface at the other end of the first outer line 3a and the other end (a lower end) connected to the upper surface of the second ground conductor 4b.

The connection conductor 6e is a conductor that electrically and mechanically connects one end of the second outer line 3b and the first ground conductor 4a. For example, the connection conductor 6e is a conductor extending in the up and down direction. The connection conductor 6e has one end (an upper end) connected to the lower surface at one end of the second outer line 3b, and the other end (a lower end) connected to the upper surface of the first ground conductor 4a.

The connection conductor 6f is a conductor that electrically and mechanically connects the other end of the second outer line 3b and the second around conductor 4b. For example, the connection conductor 6f is a conductor extending in the up and down direction. The connection conductor 6f has one end (an upper end) connected to the lower surface at the other end of the second outer line 3b and the other end (a lower end) connected to the upper surface of the second ground conductor 4b.

The connection conductor 6g is a conductor that electrically and mechanically connects the other end of the signal line 1 and the upper electrode of the capacitor 5. For example, the connection conductor 6g is a conductor extending in the up and down direction. The connection conductor 6g has one end (an upper end) connected to the lower surface at the other end of the signal line 1 and the other end (a lower end) connected to the upper electrode of the capacitor 5.

The first electronic switch 7a is connected between the other end of the first inner line 2a and the second ground conductor 4b. The first electronic switch 7a is, for example, a metal-oxide-semiconductor (MOS)-type field-effect transistor (FET). The first electronic switch 7a has a drain terminal electrically connected to the other end of the first inner line 2a, a source terminal electrically connected to the second ground conductor 4b, and a gate terminal electrically connected to the switch control unit 8. The first electronic switch 7a is controlled in a closed state or an open state on the basis of a gate signal input from the switch control unit 8 to the gate terminal. The closed state is a state in which the drain terminal and the source terminal are electrically connected. The open state is a state in which the drain terminal and the source terminal are not electrically connected and the electrical connection is disconnected. The first electronic switch 7a, a control of the switch control unit 8, is switched in an electrically connected state in which the other end of the first inner line 2a is electrically connected to the second ground conductor 4b or an electrically disconnected state in which the other end of the first inner line 2a is electrically disconnected to the second ground conductor 4b.

The second electronic switch 7b is connected between the other end of the second inner line 2b and the second ground conductor 4b. The second electronic switch 7b is, for example, a MOS-type FET. The second electronic switch 7b has a drain terminal connected to the other end of the second inner line 2b, a source terminal connected to the second ground conductor 4b, and a gate terminal connected to the switch control unit 8.

The second electronic switch 7b is controlled in a closed state or an open state on the basis of a gate signal input from the switch control unit 8 to the gate terminal. The second electronic switch 7b, by a control of the switch control unit 8, is switched in an electrically connected state in which the other end of the second inner line 2b is electrically connected to the second ground conductor 4b or an electrically disconnected state in which the other end of the second inner line 2b is electrically disconnected to the second ground conductor 4b.

The third electronic switch 7c is connected between the other end of the signal line 1 and the second ground conductor 4b. The third electronic switch 7c is, for example, a MOS-type FET, and has a drain terminal connected to the other end of the signal line 1, a source terminal connected to the second ground conductor 4b, and a gate terminal connected to the switch control unit 8. Although the third electronic switch 7c is provided on the other end side of the signal line 1 in the example shown in FIG. 2, the present invention is not limited thereto and the third electronic switch 7c may be provided on one end side of the signal line 1. In addition, the third electronic switch 7c may not be used if it is not necessary.

The third electronic switch 7c is controlled in a closed state or an open state on the basis of a gate signal input from the switch control unit 8 to the gate terminal. The third electronic switch 7c, by a control of the switch control unit 8, is switched in an electrically connected state in which the other end of the signal line 1 are electrically connected to the second ground conductor 4b or an electrically disconnected state in which the other end of the signal line 1 are electrically disconnected to the second ground conductor 4b.

The fourth electronic switch 7d is connected in series to the capacitor 5 between the other end of the signal line 1 and the second ground conductor 4b. The fourth electronic switch 7d is, for example, a MOS-type FET. In the example shown in FIG. 2, the fourth electronic switch 7d has a drain terminal connected to the lower electrode of the capacitor 5, a source terminal connected to the second ground conductor 4b, and a gate terminal connected to the switch control unit 8.

The fourth electronic switch 7d is controlled in a closed state or an open state on the basis of a gate signal input from the switch control unit 8 to the gate terminal. The fourth electronic switch 7d, by a control of the switch control unit 8, is switched in an electrically connected state in which the lower electrode of the capacitor 5 are electrically connected to the second ground conductor 4b or an electrically disconnected state in which the lower electrode of the capacitor 5 are electrically disconnected to the second ground conductor 4b.

The switch control unit 8 is a control circuit that controls the first electronic switch 7a, the second electronic switch 7b, the third electronic switch 7c, and the fourth electronic switch 7d, which are a plurality of electronic switches 7. For example, the switch control unit 8 includes four output ports. The switch control unit 8 individually controls each of the plurality of electronic switches 7 in an open state or a closed state by outputting separate gate signals from the output ports and supplying the gate signals to the gate terminals of the plurality of electronic switches 7.

Although a schematic diagram in which the digital phase shift circuit 10 is viewed in perspective so that the mechanical structure of the digital phase shift circuit 10 is easily understood is shown in FIG. 2, the actual digital phase shift circuit 10 is formed as a multilayer structure using semiconductor manufacturing technology.

As an example, in the digital phase shift circuit 10, the signal line 1, the first inner line 2a, the second inner line 2b, the first outer line 3a, and the second outer line 3b are formed on the first conductive layer. The first ground conductor 4a and the second ground conductor 4b are formed on a second conductive layer opposed to the first conductive layer in a state in which an insulating layer is sandwiched. A component formed on the first conductive layer and a component formed on the second conductive layer are connected to each other through via-holes. The plurality of connection conductors 6 correspond to the via-holes buried inside of the insulating layer.

Next, an operation of the digital phase shift circuit 10 in the present embodiment will be described. The digital phase shift circuit 10 has a high-delay mode and a low-delay mode as operating modes. The digital phase shift circuit 10 operates in the high-delay mode or the low-delay mode.

<<High-Delay Mode>>

Figure 3:
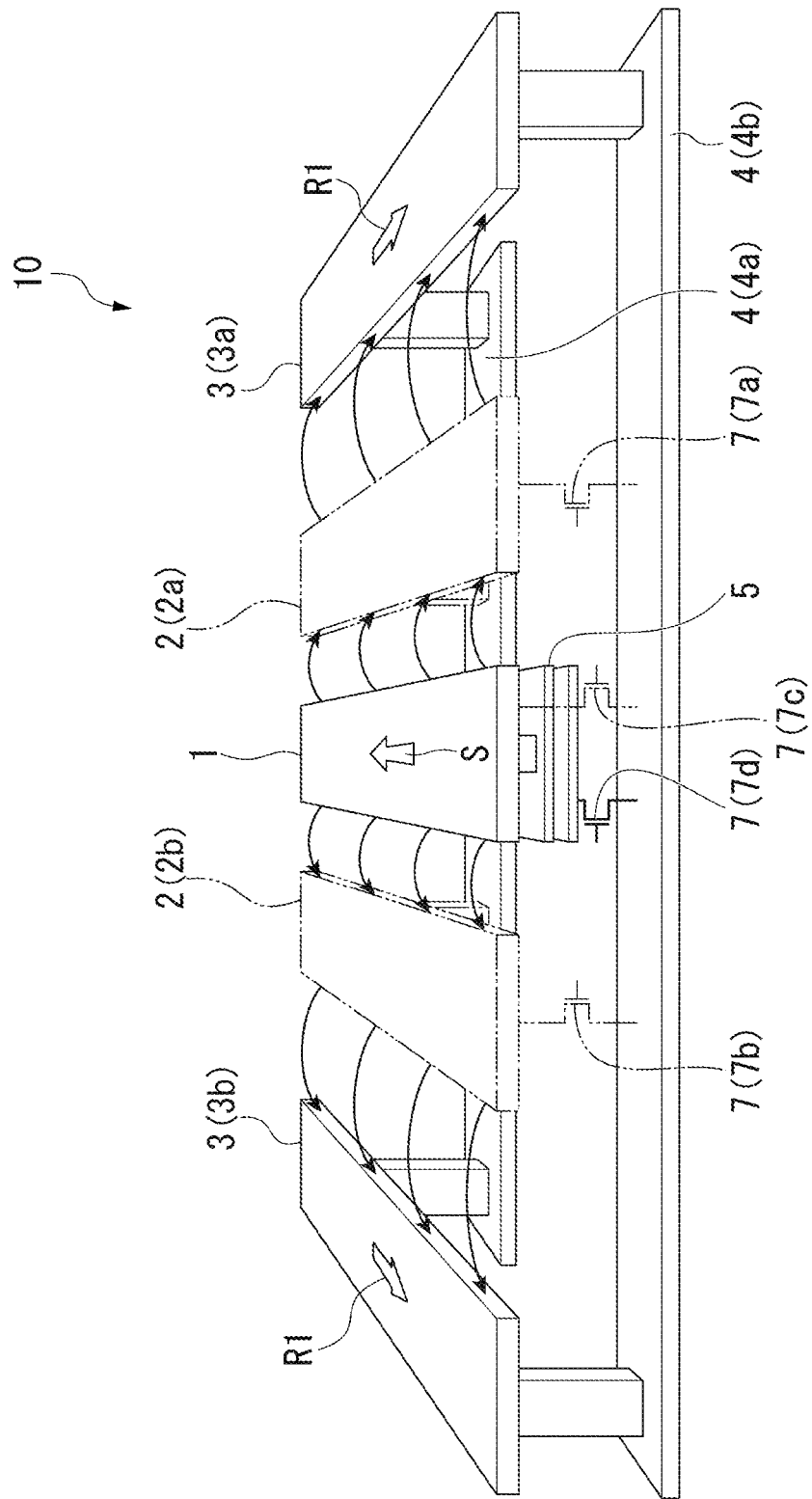
FIG. 3 is a diagram for describing a high-delay mode of the digital phase shift circuit according to the embodiment of the present invention.

FIG. 3 is a diagram for describing the high-delay mode of the digital phase shift circuit according to the embodiment of the present invention. The high-delay mode is a mode in which a first phase difference is generated in the signal S. In the high-delay mode, as shown in FIG. 3, the first electronic switch 7a and the second electronic switch 7b are controlled in the open state and the fourth electronic switch 7d is controlled in the closed state.

The first electronic switch 7a is controlled in the open state and therefore the electrical connection between the other end of the first inner line 2a and the second ground conductor 4b is disconnected. The second electronic switch 7b is controlled in the open state and therefore the electrical connection between the other end of the second inner line 2b and the second ground conductor 4b is disconnected. The fourth electronic switch 7d is controlled in the closed state and therefore the other end of the signal line 1 is connected to the second ground conductor 4b via the capacitor 5.

When the signal S propagates through the signal line 1 in a direction from the input end (the other end) to the output end (one end), the return current R1 flows from the one end to the other end in a direction opposite that of the signal S. In the high-delay mode, because the first electronic switch 7a and the second electronic switch 7b are in the open state, the return current R1 mainly flows through the first outer line 3a and the second outer line 3b as shown in FIG. 3.

Because the return current R1 flows through the first outer line 3a and the second outer line 3b in the high-delay mode, the inductance value L is larger than that in the low-delay mode. In the high-delay mode, it is possible to obtain a delay amount larger than that in the low-delay mode. Also, because the other end of the signal line 1 and the second ground conductor 4b are electrically connected by the capacitor 5 when the fourth electronic switch 7d is in the closed state, the capacitance value C of the digital phase shift circuit 10 is also large. Consequently, in the high-delay mode, it is possible to obtain a delay amount larger than that in the low-delay mode.

<<Low-Delay Mode>>

Figure 4:
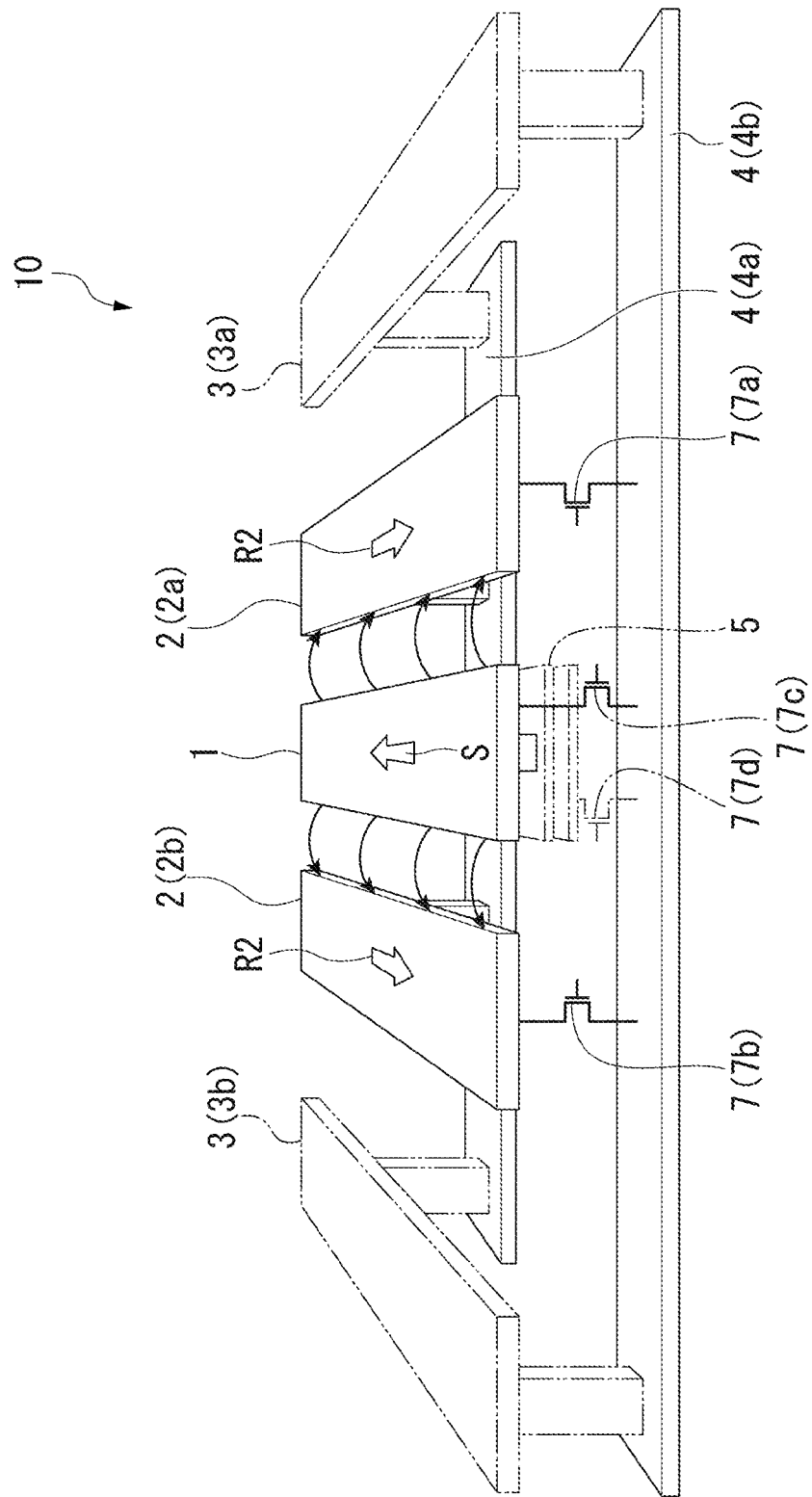
FIG. 4 is a diagram for describing a low-delay mode of the digital phase shift circuit according to the embodiment of the present invention.

FIG. 4 is a diagram for describing the low-delay mode of the digital phase shift circuit according to the embodiment of the present invention. The low-delay mode is a mode in which a second phase difference smaller than a first phase difference is generated in the signal S. In the low-delay mode, as shown in FIG. 4, the first electronic switch 7a and the second electronic switch 7b are controlled in a closed state and the fourth electronic switch 7d is controlled in an open state.

When the first electronic switch 7a is controlled in the closed state, the other end of the first inner line 2a and the second ground conductor 4b are electrically connected. When the second electronic switch 7b is controlled in the closed state, the other end of the second inner line 2b and the second around conductor 4b are electrically connected.

When the signal S propagates through the signal line 1 in a direction from the input end (the other end) to the output end (one end), the return current R2 flows from the one end to the other end in a direction opposite that of the signal S. In the low-delay mode, because the first electronic switch 7a and the second electronic switch 7b are in the closed state, the return current R2 mainly flows through the first inner line 2a and the second inner line 2b as shown in FIG. 4.

Because the return current R2 flows through the first inner line 2a and the second inner line 2b in the low-delay mode, the inductance value L is smaller than that in the high-delay mode. The delay amount in the low-delay mode is smaller than the delay amount in the high-delay mode. Although the capacitor 5 is connected to the other end of the signal line 1, because the fourth electronic switch 7d is in the open state, the capacitance of capacitor 5 is non-functional (invisible from the signal line 1) and there is only parasitic capacitance that is significantly less than the capacitance of the capacitor 5. Consequently, in the low-delay mode, it is possible to obtain a delay amount smaller than that in the high-delay mode.

Here, in the low-delay mode, the loss of the signal line 1 can be intentionally increased by controlling the third electronic switch 7c in a closed state. This is to make the loss of the high-frequency signal in the low-delay mode substantially equal to the loss of the high-frequency signal in the high-delay mode.

That is, the loss of the high-frequency signal in the low-delay mode is clearly less than the loss of the high-frequency signal in the high-delay mode. This loss difference causes an amplitude difference of the high-frequency signal output from the digital phase shift circuit 10 when the operation mode is switched between the low-delay mode and the high-delay mode. In relation to this circumstance, the digital phase shift circuit 10 can eliminate the above-described amplitude difference by controlling the third electronic switch 7c in the closed state in the low-delay mode.

<Mitigation Circuit>
<<First Mitigation Circuit>>

FIGS. 5A to 5D are diagrams for describing the first mitigation circuit of the mitigation circuits according to the embodiment of the present invention. The basic configuration of the first mitigation circuit RC1 is substantially similar to the digital phase shift circuit 10 (hereinafter referred to as a "standard digital phase shift circuit ST") other than the mitigation circuit RC (the first mitigation circuit RC1 and the second mitigation circuit RC2). However, the configuration of the first mitigation circuit RC1 is slightly different from that of the standard digital phase shift circuit ST so that the first mitigation circuit RC1 has a larger phase shift amount than the standard digital phase shift circuit ST.

Specifically, the first mitigation circuit RC1 has a configuration that satisfies at least one of the conditions listed below.

Condition 1: The length of the first mitigation circuit RC1 is longer than the length of the standard digital phase shift circuit ST.

Condition 2: The distance between the signal line 1 and the inner line 2 in the first mitigation circuit RC1 is shorter than that in the standard digital phase shift circuit ST.

Condition 3: The distance between the signal line 1 and the outer line 3 in the first mitigation circuit RC1 is longer than that in the standard digital phase shift circuit ST.

Condition 4: The capacitor 5 of the first mitigation circuit RC1 is larger than that of the standard digital phase shift circuit ST.

Condition 5: The electronic switches 7a and 7b of the first mitigation circuit RC1 are larger than those of the standard digital phase shift circuit ST.

Figure 5A:
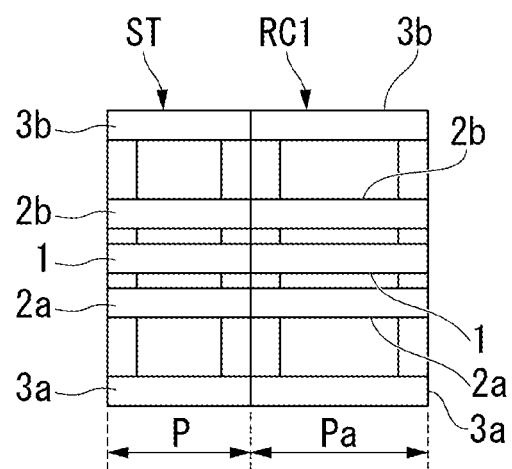
FIGS. 5A to 5D are diagrams for describing a first mitigation circuit of mitigation circuits according to the embodiment of the present invention.

FIG. 5A is a diagram showing the first mitigation circuit RC1 satisfying the above "condition 1." A length Pa of the first mitigation circuit RC1 shown in FIG. 5A (the length of the signal line 1, the inner line 2, the outer line 3, or the like) is longer than a length P of the standard digital phase shift circuit ST.

Figure 5B:
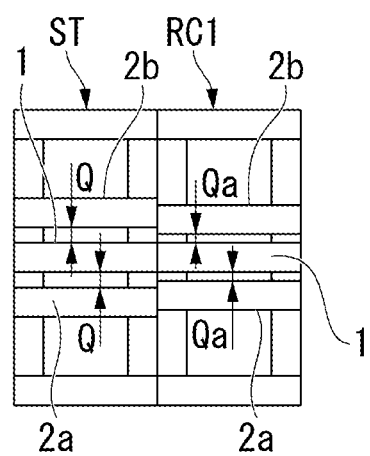

FIG. 5B is a diagram showing the first mitigation circuit RC1 satisfying the above-described "condition 2." In the first mitigation circuit RC1 shown in FIG. 5B, a distance Qa between the signal line 1 and the inner line 2 (the first inner line 2a and the second inner line 2b) is shorter than a distance Q between the signal line 1 and the inner line 2 (the first inner line 2a and the second inner line 2b) in the standard digital phase shift circuit ST.

Figure 5C:
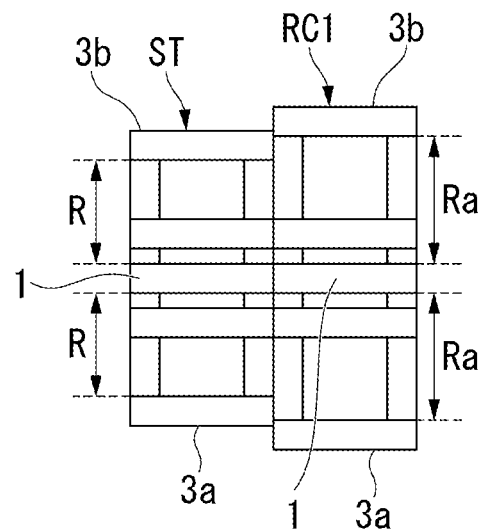

FIG. 5C is a diagram showing the first mitigation circuit RC1 satisfying the above-described "condition 3." In the first mitigation circuit RC1 shown in FIG. 5C, a distance Ra between the signal line 1 and the outer line 3 (the first outer line 3a and the second outer line 3b) is longer than a distance R between the signal line 1 and the outer line 3 (the first outer line 3a and the second outer line 3b) in the standard digital phase shift circuit ST.

Figure 5D:
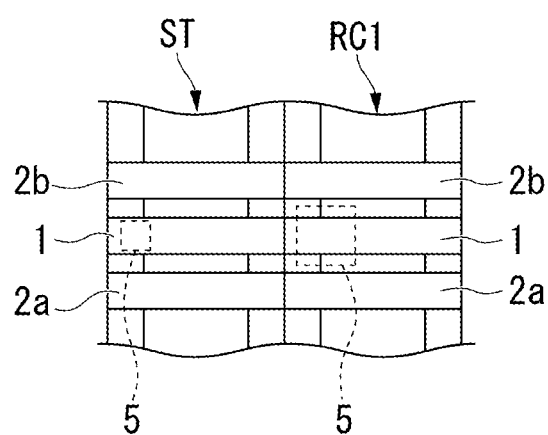

FIG. 5D is a diagram showing the first mitigation circuit RC1 satisfying the above-described "condition 4." A size of the capacitor 5 in the first mitigation circuit RC1 shown in FIG. 5D is larger than that of the capacitor 5 in the standard digital phase shift circuit ST. Although not shown, sizes of the first electronic switch 7a and the second electronic switch 7b (see FIGS. 2 to 4) of the first mitigation circuit RC1 satisfying the above-described "condition 5" are larger than those of the first electronic switch 7a and the second electronic switch 7b of the standard digital phase shift circuit ST.

As described above, the first mitigation circuit RC1 has a larger phase shift amount than the standard digital phase shift circuit ST. Thus, it is possible to increase the phase shift amount using the first mitigation circuit RC1 instead of the standard digital phase shift circuit ST. Therefore, for example, when a distribution of phase shift amounts caused by weak reflections occurring in front of and behind the connection unit has a recess portion (see FIGS. 10A to 10C), the first mitigation circuit RC1 can be used to mitigate the recess portion.

<<Second Mitigation Circuit>>

FIGS. 6A to 6D are diagrams for describing the second mitigation circuit of the mitigation circuits according to the embodiment of the present invention. A basic configuration of the second mitigation circuit RC2 is substantially similar to that of the standard digital phase shift circuit ST like the first mitigation circuit RC1. However, a configuration of the second mitigation circuit RC2 is slightly different from that of the standard digital phase shift circuit ST so that the second mitigation circuit RC2 has a smaller phase shift amount than the standard digital phase shift circuit ST.

Specifically, the second mitigation circuit RC2 has a configuration that satisfies at least one of the conditions listed below.

Condition 1: The length of the second mitigation circuit RC2 is shorter than the length of the standard digital phase shift circuit ST.
  Condition 2: The distance between the signal line 1 and the inner line 2 in the second mitigation circuit RC2 is longer than that in the standard digital phase shift circuit ST.
  Condition 3: The distance between the signal line 1 and the outer line 3 in the second mitigation circuit RC2 is shorter than that in the standard digital phase shift circuit ST.
  Condition 4: The capacitor 5 of the second mitigation circuit RC2 is smaller than that of the standard digital phase shift circuit ST.
  Condition 5: The electronic switches 7a and 7b of the second mitigation circuit RC2 are smaller than those of the standard digital phase shift circuit ST.

Figure 6A:
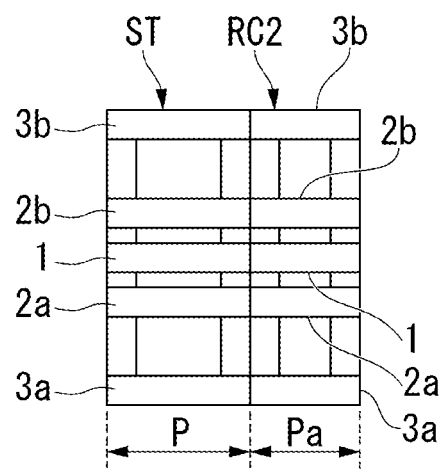
FIGS. 6A to 6D are diagrams for describing a second mitigation circuit of the mitigation circuits according to the embodiment of the present invention.

FIG. 6A is a diagram showing the second mitigation circuit RC2 satisfying the above "condition 1." A length Pa of the second mitigation circuit RC2 shown in FIG. 6A (the length of the signal line 1, the inner line 2, the outer line 3, or the like) is shorter than a length P of the standard digital phase shift circuit ST.

Figure 6B:
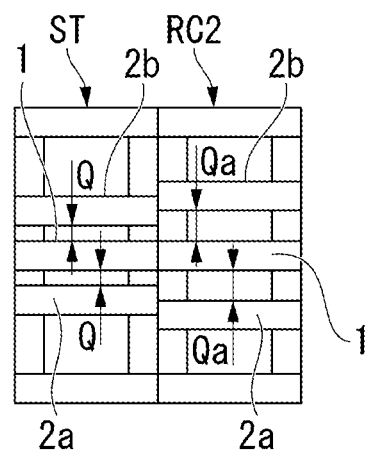

FIG. 6B is a diagram showing the second mitigation circuit RC2 satisfying the above-described "condition 2." In the second mitigation circuit RC2 shown in FIG. 6B, a distance Qa between the signal line 1 and the inner line 2 (the first inner line 2a and the second inner line 2b) is longer than a distance Q between the signal line 1 and the inner line 2 (the first inner line 2a and the second inner line 2b) in the standard digital phase shift circuit ST.

Figure 6C:
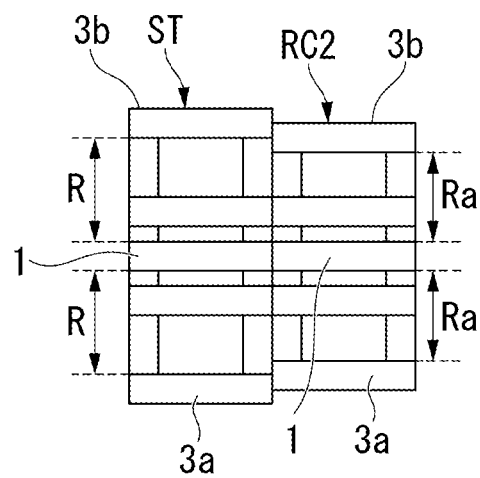

FIG. 6C is a diagram showing the second mitigation circuit RC2 satisfying the above-described "condition 3." In the second mitigation circuit RC2 shown in FIG. 6C, a distance Ra between the signal line 1 and the outer line 3 (the first outer line 3a and the second outer line 3b) is shorter than a distance R between the signal line 1 and the outer line 3 (the first outer line 3a and the second outer line 3b) in the standard digital phase shift circuit ST.

Figure 6D:
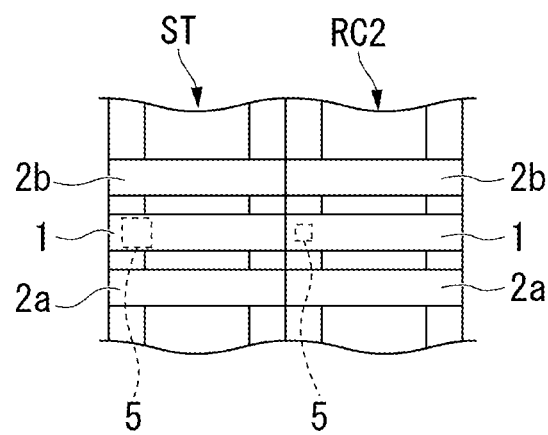

FIG. 6D is a diagram showing the second mitigation circuit RC2 satisfying the above-described "condition 4." A size of the capacitor 5 in the second mitigation circuit RC2 shown in FIG. 6D is smaller than that of the capacitor 5 in the standard digital phase shift circuit ST. Although not shown, sizes of the first electronic switch 7a and the second electronic switch 7b (see FIGS. 2 to 4) of the second mitigation circuit RC2 satisfying the above-described "condition 5" are smaller than those of the first electronic switch 7a and the second electronic switch 7b of the standard digital phase shift circuit ST.

As described above, the second mitigation circuit RC2 has a smaller phase shift amount than the standard digital phase shift circuit ST. Thus, it is possible to decrease the phase shift amount using the second mitigation circuit RC2 instead of the standard digital phase shift circuit ST. Therefore, for example, when a distribution of phase shift amounts caused by weak reflections occurring in front of and behind the connection unit has a projection portion (see FIGS. 10A to 10C), the second mitigation circuit RC2 can be used to mitigate the projection portion.

<Connection Unit>

Figure 7:
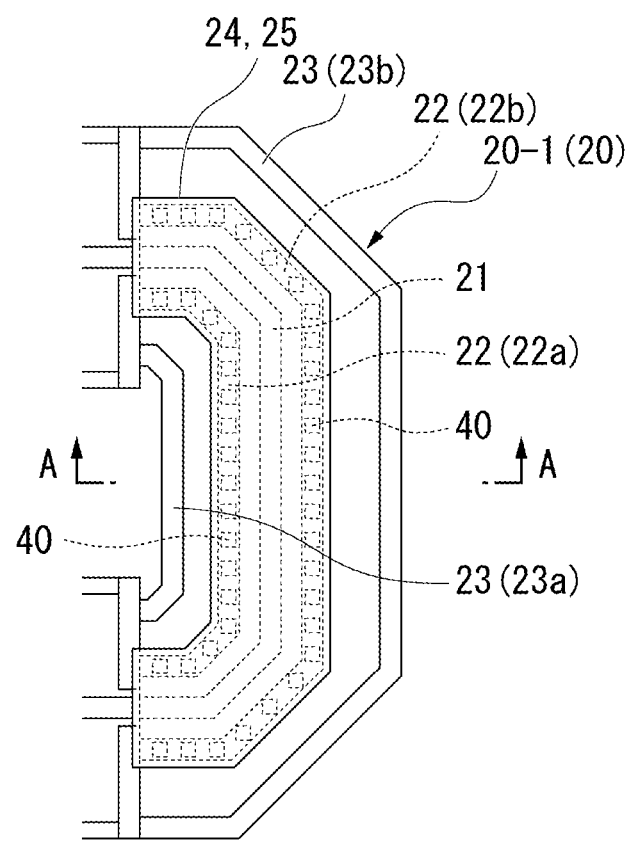
FIG. 7 is a plan view showing a main configuration of a connection unit according to the embodiment of the present invention.
Figure 8:
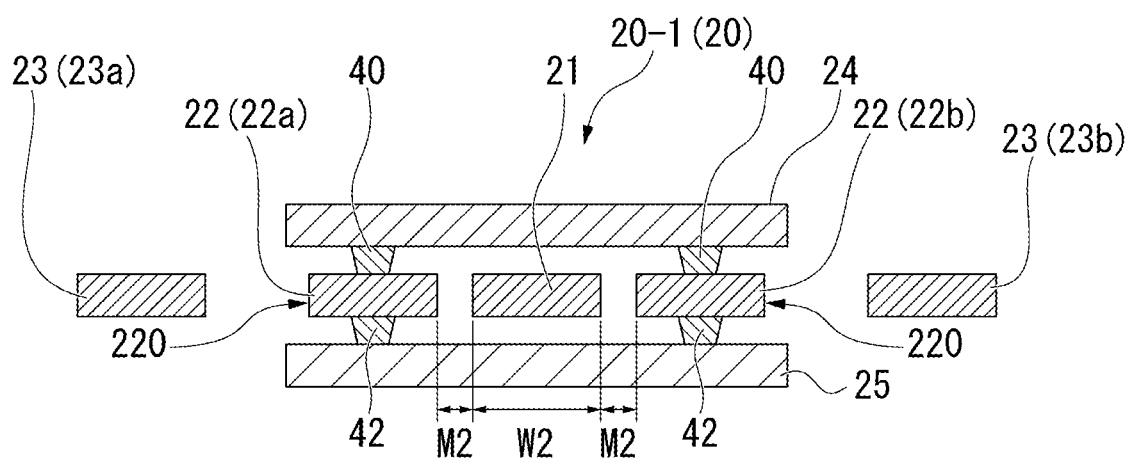
FIG. 8 is a cross-sectional view taken along line A-A in FIG. 7.

FIG. 7 is a plan view showing a main configuration of the connection unit according to the embodiment of the present invention. FIG. 8 is a cross-sectional view taken along line A-A in FIG. 7. In addition, the digital phase shifter 100 of the present embodiment includes three connection units 20 (connection units 20-1, 20-2, and 20-3). The connection unit 20-1 will be described here because the three connection units 20 have similar configurations. As shown in FIGS. 7 and 8, the connection unit 20-1 includes a first connection line 21, a second connection line 22, a third connection line 23, a first ground layer 24, and a second ground layer 25.

The first connection line 21 is, for example, a long plate-shaped conductor having a certain width W2, a certain thickness, and a predetermined length. The first connection line 21 connects the signal line 1 of the digital phase shift circuit 10-10 and the signal line 1 of the digital phase shift circuit 10-11. The signal S output from the signal line 1 of the digital phase shift circuit 10-10 is input to the signal line 1 of the digital phase shift circuit 10-11 via the first connection line 21. In addition, the width W2 of the first connection line 21 may be similar to the width W1 of the signal line 1 or may be wider than the width W1.

The second connection line 22 is a long plate-shaped conductor having a certain width, a certain thickness, and a predetermined length. The second connection line 22 extends in a direction that is the same as the extension direction of the signal line 1. The second connection line 22 is provided parallel to the first connection line 21 and is separated by a predetermined distance M2. Specifically, the second connection line 22 is arranged at both sides of the first connection line 21 at an interval of a predetermined distance M2 from the first connection line 21. In addition, in the following description, the second connection line 22 arranged at one side of the first connection line 21 may be referred to as a "second connection line 22a" and the second connection line 22 arranged at the other side of the first connection line 21 may be referred to as a "second connection line 22b."

The predetermined distance M2 may be equivalent to the predetermined distance M1 or may be shorter than the predetermined distance M1. For example, when the predetermined distance M1 is 10 μm, the predetermined distance M2 may be set to less than 10 μm. More preferably, the predetermined distance M2 is, for example, 2.5 μm or 2 μm or less, and it is desirable to make the second connection line 22 as close as possible to the first connection line 21. In the present embodiment, the second connection line 22 may be made close to the manufacturing limit or near the manufacturing limit with respect to the first connection line 21.

The second connection line 22 connects the inner line 2 of the digital phase shift circuit 10-10 and the inner line 2 of the digital phase shift circuit 10-11. In the example shown in FIG. 7, the second connection line 22a has one end connected to the first inner line 2a of the digital phase shift circuit 10-10 and the other end connected to the first inner line 2a of the digital phase shift circuit 10-11. The second connection line 22b has one end connected to the second inner line 2b of the digital phase shift circuit 10-10 and the other end connected to the second inner line 2b of the digital phase shift circuit 10-11.

The third connection lines 23 are strip-shaped conductors provided farther from the first connection line 21 than the second connection line 22 at both sides that are one side and the other side of the first connection line 21. The third connection line 23 is provided parallel to the first connection line 21 at an interval of a predetermined distance in a state in which the second connection line 22 is sandwiched between the first connection line 21 and the third connection line 23. In addition, in the following description, the third connection line 23 arranged at the one side of the first connection line 21 may be referred to as a "third connection line 23a" and the third connection line 23 arranged at the other side of the first connection line 21 may be referred to as a "third connection line 23b."

The third connection line 23 connects the outer line 3 of the digital phase shift circuit 10-10 and the outer line 3 of the digital phase shift circuit 10-11. In the example shown in FIG. 7, the third connection line 23a has one end connected to the first outer line 3a of the digital phase shift circuit 10-10 and the other end connected to the first outer line 3a of the digital phase shift circuit 10-11. The third connection line 23b has one end connected to the second outer line 3b of the digital phase shift circuit 10-10 and the other end connected to the second outer line 3b of the digital phase shift circuit 10-11.

The first ground layer 24 is provided above the first connection line 21 and the second connection line 22 at an interval of a predetermined distance therefrom. In the first ground layer 24, the width of the first ground layer 24 preferably extends to at least one side surface 220 of each second connection line 22. The side surface 220 is a side surface opposed to the side where the first connection line 21 is arranged.

The first ground layer 24 is connected to each of the second connection line 22a and the second connection line 22b via via-holes 40. As shown in FIG. 7, a plurality of via-holes 40 are arrayed along the second connection line 22a and a plurality of via-holes 40 are arrayed along the second connection line 22b.

The second ground layer 25 is provided below the first connection line 21 and the second connection line 22 at an interval of a predetermined distance therefrom. In the second ground layer 25, the width of the second ground layer 25 preferably extends to at least one side surface 220 of each second connection line 22.

The second ground layer 25 is connected to each of the second connection line 22a and the second connection line 22b via via-holes 42. Like the via-holes 40, a plurality of via-holes 42 are arrayed along the second connection line 22a and a plurality of via-holes 42 are arrayed along the second connection line 22b.

Figure 9:
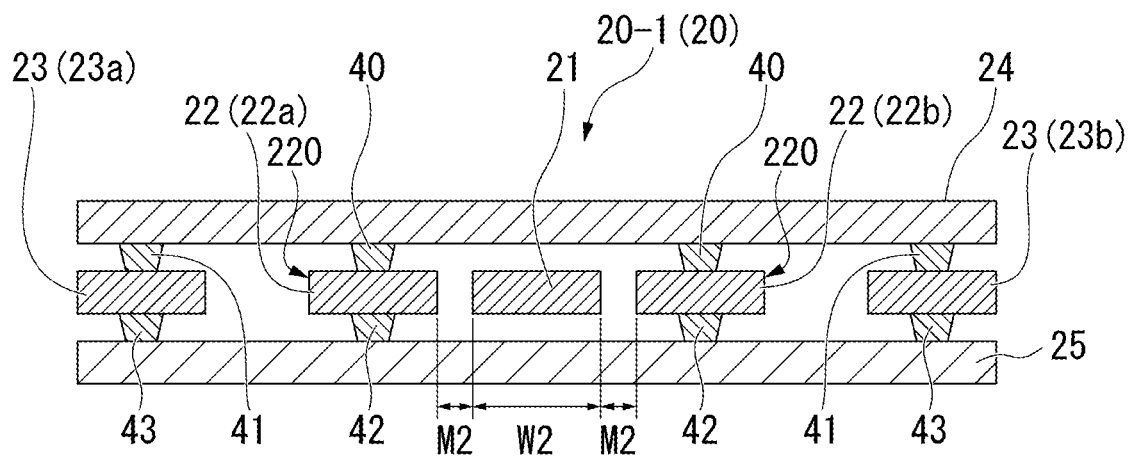
FIG. 9 is a cross-sectional view showing a modified example of the connection unit according to the embodiment of the present invention.

FIG. 9 is a cross-sectional view showing a modified example of the connection unit according to the embodiment of the present invention. As shown in FIG. 9, the connection unit 20 may have the first ground layer 24 extending above the third connection line 23 and the second ground layer 25 extending below the third connection line 23.

In this modified example, the first ground layer 24 is connected to each of the second connection line 22a and the second connection line 22b via the via-holes 40 and is connected to each of the third connection line 23a and the third connection line 23b via via-holes 41. In addition, in the configuration illustrated in FIG. 9, a plurality of via-holes 41 are arrayed along the third connection line 23a and a plurality of via-holes 41 are arrayed along the third connection line 23b.

Also, the second ground layer 25 is connected to each of the second connection line 22a and the second connection line 22b via via-holes 42 and is connected to each of the third connection line 23a and the third connection line 23b via via-holes 43. In addition, in the configuration illustrated in FIG. 9, like the via-holes 41, a plurality of via-holes 43 are arrayed along the third connection line 23a and a plurality of via-holes 43 are arrayed along the third connection line 23b.

Although the connection unit 20-1 has a first ground layer 24 and a second ground layer 25 in the example shown in FIGS. 8 and 9, the present invention is not limited thereto. At least one of the first ground layer 24 and the second ground layer 25 may be provided. That is, a ground layer may be arranged in at least one of an upward direction and a downward direction of the first connection line 21.

<Characteristics of Digital Phase Shifter>

Figure 10A:
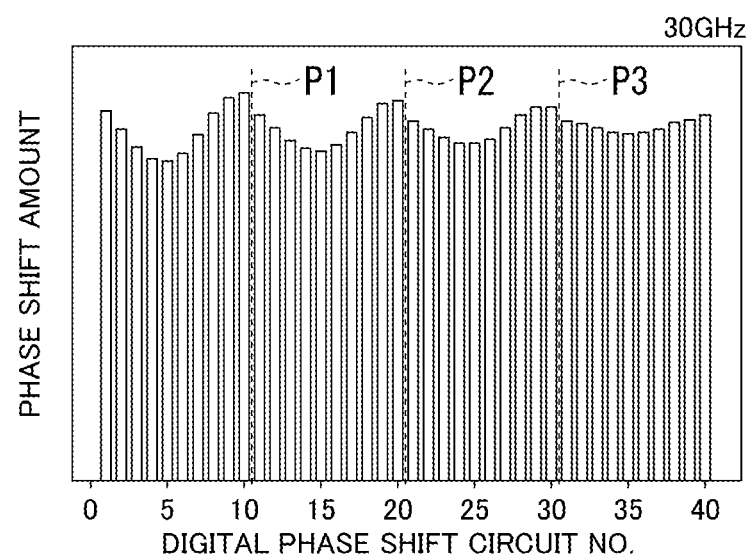
FIGS. 10A to 10C are diagrams showing examples of a distribution of phase shift amounts generated in the digital phase shifter.
Figure 10B:
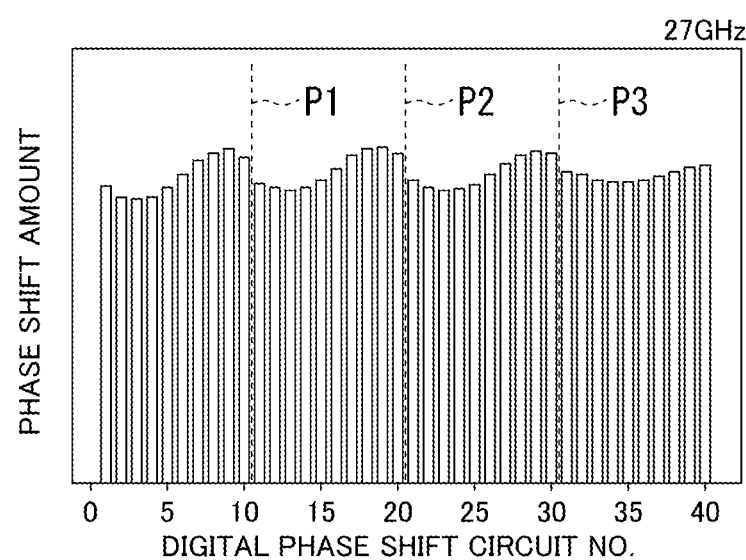
Figure 10C:
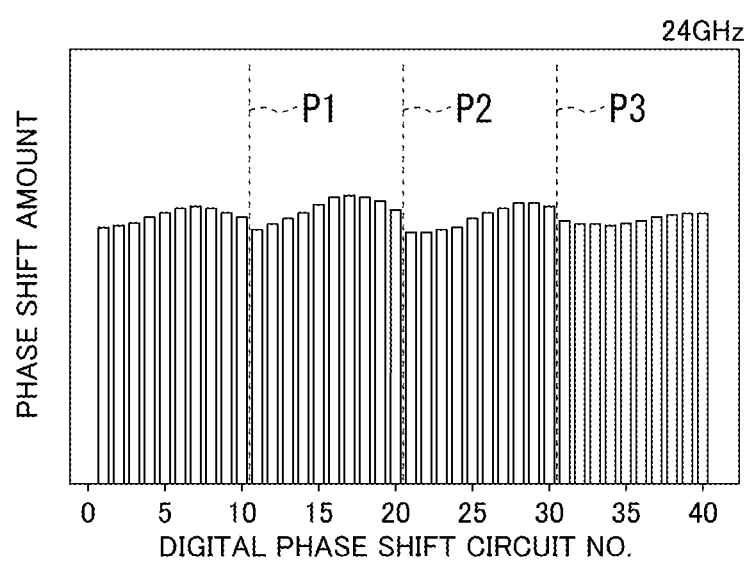

FIGS. 10A to 10C are diagrams showing an example of a distribution of phase shift amounts generated in a digital phase shifter. The phase shift amount distributions shown in FIGS. 10A to 10C are for a digital phase shift circuit in which the mitigation circuit RC (the first mitigation circuit RC1 and the second mitigation circuit RC2) is not provided. In addition, in the graphs shown in FIGS. 10A to 10C, the horizontal axis represents a number ("1" to "40") of the digital phase shift circuit 10 and the vertical axis represents a phase shift amount for each digital phase shift circuit 10.

The phase shift amount distributions shown in FIGS. 10A to 10C are obtained when switching control is sequentially performed for the low-delay mode in the order of the digital phase shift circuits 10-1 to 10-40 from the state where all the digital phase shift circuits 10-1 to 10-40 are set in the high-delay mode. The phase shift amount distribution shown in FIG. 10A is that of a case where the frequency of the signal S is 30 [GHz]. The phase shift amount distribution shown in FIG. 10B is that of a case where the frequency of the signal S is 27 [GHz]. The phase shift amount distribution shown in FIG. 10C is that of a case where the frequency of the signal S is 24 [GHz]. The ideal characteristic of the digital phase shifter 100 is that the upper part of each of the graphs shown in FIGS. 10A to 10C is flat (there is no distribution of phase shift amounts).

In addition, the control of the digital phase shift circuits 10-1 to 10-40 starts from the digital phase shift circuit 10-1 and is performed sequentially in the connection order of the digital phase shift circuits 10-1 to 10-40. This is because the capacitor 5 is provided on (connected to) (the ground conductor of) a side opposed to the side to which the digital phase shift circuit 10-($n$+1) in the digital phase shift circuit 10-$n$ (n is an integer satisfying 1≤n≤39) is connected.

That is, among the digital phase shift circuits 10 constituting the digital phase shift circuit groups 30-1 to 30-4 connected in a meander shape, digital phase shift circuits located at an outermost side are the digital phase shift circuit 10-1 and the digital phase shift circuit 10-40. Control is started from the digital phase shift circuit 10-1 in which the capacitor 5 is provided on a side opposed to the side to which the digital phase shift circuit 10-2 is connected within the digital phase shift circuit 10-1 and the digital phase shift circuit 10-40.

In addition, in FIGS. 10A to 10C, a dashed line denoted by reference sign P1 indicates the position of the connection unit 20-1, a dashed line denoted by reference sign P2 indicates the position of the connection unit 20-2, and a dashed line denoted by reference sign P3 indicates the position of the connection unit 20-3.

First, referring to FIG. 10A, it can be seen that a recess portion occurs in the distribution of phase shift amounts between the connection units 20 (between the positions P1 and P2 and between the positions P2 and P3). Also, it can be seen that the phase shift amount has increased in front of the connection unit 20 (in front of the positions P1, P2, and P3). In addition, the front side of the connection unit 20 is the front side in the control direction of the digital phase shift circuit 10 (a direction from the digital phase shift circuit 10-1 to the digital phase shift circuit 10-40).

Thus, when the frequency of the signal S is 30 [GHz], it is desirable to designate at least one of the digital phase shift circuits 10 constituting at least one digital phase shift circuit group 30 (the digital phase shift circuit groups 30-2 and 30-3) having both ends connected to the connection unit 20 as the first mitigation circuit RC1. Also, it is desirable to designate at least one digital phase shift circuit 10 (preferably, at least two or more digital phase shift circuit 10) located in front of at least one connection unit 20 as the second mitigation circuit RC2.

For example, in the digital phase shifter 100 shown in FIG. 1, it is desirable to designate the digital phase shift circuits 10-14 and 10-15 constituting the digital phase shift circuit group 30-2 and the digital phase shift circuits 10-24 and 10-25 constituting the digital phase shift circuit group 30-3 as the first mitigation circuit RC1. Also, it is desirable to designate the digital phase shift circuits 10-9 and 10-10 located in front of the connection unit 20-1, the digital phase shift circuits 10-19 and 10-20 located in front of the connection unit 20-2, and the digital phase shift circuits 10-29 and 10-30 located in front of the connection unit 20-3 as the second mitigation circuit RC2.

Next, referring to FIG. 10B, it can be seen that the phase shift amount is significantly decreased behind the connection unit 20 (behind the positions P1, P2, and P3) and the phase shift amount is increased in front of the connection unit 20 (in front of the positions P1, P2, P3). In addition, the rear side of the connection unit 20 is the rear side in the control direction of the digital phase shift circuit 10 (a direction from the digital phase shift circuit 10-1 to the digital phase shift circuit 10-40).

Thus, when the frequency of the signal S is 27 [GHz], it is desirable to designate at least one of the digital phase shift circuits 10 located behind the connection unit 20 as the first mitigation circuit RC1. Also, it is desirable to designate at least one digital phase shift circuit 10 (preferably, at least three or more digital phase shift circuits 10) located in front of at least one connection unit 20 as the second mitigation circuit RC2.

For example, in the digital phase shifter 100 shown in FIG. 1, it is desirable to designate the digital phase shift circuit 10-11 located behind the connection unit 20-1, the digital phase shift circuit 10-21 located behind the connection unit 20-2, and the digital phase shift circuit 10-31 located behind the connection unit 20-3 as the first mitigation circuit RC1. Also, it is desirable to designate the digital phase shift circuits 10-8 to 10-10 located in front of the connection unit 20-1, the digital phase shift circuits 10-18 to 10-20 located in front of the connection unit 20-2, and the digital phase shift circuits 10-28 to 10-30 located in front of the connection unit 20-3 as the second mitigation circuit RC2.

Subsequently, referring to FIG. 10C, it can be seen that the phase shift amount is decreased behind the connection unit 20 (behind the positions P1, P2, and P3) as in FIG. 10B. However, it can be seen that the phase shift amount in front of the connection unit 20 (in front of the positions P1, P2, and P3) is not as large as that in FIG. 10B.

Thus, when the frequency of the signal S is 24 [GHz], it is desirable to designate at least one of the digital phase shift circuits 10 located behind at least one connection unit 20 as the first mitigation circuit RC1. For example, in the digital phase shifter 100 shown in FIG. 1, it is desirable to designate the digital phase shift circuit 10-11 located behind the connection unit 20-1, the digital phase shift circuit 10-21 located behind the connection unit 20-2, and the digital phase shift circuit 10-31 located behind the connection unit 20-3 as the first mitigation circuit RC1.

As described above, in the present embodiment, there are provided a plurality of digital phase shift circuit groups 30 in which a plurality of digital phase shift circuits 10 are connected in cascade and one or more bend-type connection units 20 connected between two digital phase shift circuit groups 30. At least one of the digital phase shift circuits 10 constituting at least one digital phase circuit group 30 is a mitigation circuit RC that mitigates a distribution of phase shift amounts. Thus, the distribution of phase shift amounts caused by weak reflections occurring in front of and behind the connection unit 20 can be Mitigated.

Here, the mitigation circuit RC includes at least one of the first mitigation circuit RC1, which is a digital phase shift circuit 10 having a larger phase shift amount than the standard digital phase shift circuit ST, and the second mitigation circuit RC2, which is a digital phase shift circuit 10 having a smaller phase shift amount than the standard digital phase shift circuit ST. It is possible to mitigate a recess portion in the distribution of phase shift amounts using the first mitigation circuit RC1 and it is possible to mitigate a projection portion in the distribution of phase shift amounts using the second mitigation circuit RC2. Thus, using the first mitigation circuit RC1 and the second mitigation circuit RC2, it is possible to take a countermeasure regardless of whether the distribution of phase shift amounts has a recess portion or a projection portion.

Although an embodiment of the present invention has been described above, the present invention is not limited to the above embodiment and modifications can be freely made within the scope of the present invention. Although a case where the frequency of the signal S is, for example, 24, 27, or 30 [GHz] has been described in the above-described embodiment, the frequency of the signal S may be a frequency other than 24, 27, or 30 [GHz]. For example, the frequency of the signal S may be any frequency in the frequency band of microwaves, quasi-millimeter waves, millimeter waves, or the like.

Also, an example in which the digital phase shifter 100 includes the standard digital phase shift circuit ST, the first mitigation circuit RC1, and the second mitigation circuit RC2 has been described in the above-described embodiment. However, the digital phase shifter 100 may include only the standard digital phase shift circuit ST and the first mitigation circuit RC1 or may include only the standard digital phase shift circuit ST and the second mitigation circuit RC2.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A digital phase shifter comprising:
    a plurality of digital phase shift circuit groups in which a plurality of digital phase shift circuits are connected in cascade; and
    one or more bend-type connection units connected between two digital phase shift circuit groups,
    wherein each of the digital phase shift circuits includes at least a signal line, a pair of inner lines provided at both sides of the signal line, a pair of outer lines provided outside of the inner lines, a first ground conductor connected to one end of each of the inner lines and the outer lines, a second ground conductor connected to the other end of each of the outer lines, a pair of electronic switches provided between the other ends of the inner line and the second ground conductor, and a capacitor electrically connected between the signal line and at least one of the first ground conductor and the second ground conductor,
    wherein each of the digital phase shift circuits is a circuit set in a low-delay mode in which a return current flows through the inner line or a high-delay mode in which a return current flows through the outer line, and
    wherein at least one of the digital phase shift circuits constituting at least one digital phase shift circuit group is a mitigation circuit configured to mitigate a distribution of phase shift amounts.

2. The digital phase shifter according to claim 1, wherein the mitigation circuit includes at least one of:
    a first mitigation circuit that is the digital phase shift circuit having a larger phase shift amount than the digital phase shift circuit other than the mitigation circuit and that is configured to mitigate a recess portion in the distribution of phase shift amounts; and
    a second mitigation circuit that is the digital phase shift circuit having a smaller phase shift amount than the digital phase shift circuit other than the mitigation circuit and that is configured to mitigate a projection portion in the distribution of phase shift amounts.

3. The digital phase shifter according to claim 2, wherein at least one of the digital phase shift circuits constituting at least one digital phase shift circuit group having both ends connected to the connection unit is the first mitigation circuit.

4. The digital phase shifter according to claim 2, wherein a control of whether to set the mode as the low-delay mode or the high-delay mode in the digital phase shift circuit is started from the digital phase shift circuit which is located at a side in which the capacitor is provided between two digital phase shift circuits located at an outermost side and is sequentially performed in a connection order of the digital phase shift circuits.

5. The digital phase shifter according to claim 4, wherein at least one digital phase shift circuit located behind at least one connection unit in a direction in which the digital phase shift circuit is controlled is the first mitigation circuit.

6. The digital phase shifter according to claim 4, wherein at least one digital phase shift circuit located in front of at least one connection unit in a direction in which the digital phase shift circuit is controlled is the second mitigation circuit.

7. The digital phase shifter according to claim 2,
    wherein the first mitigation circuit satisfies at least one of a condition that a length of the first mitigation circuit is longer than that of the digital phase shift circuit other than the mitigation circuit, a condition that a distance between the signal line and the inner line in the first mitigation circuit is shorter than that in the digital phase shift circuit other than the mitigation circuit, a condition that a distance between the signal line and the outer line in the first mitigation circuit is longer than that in the digital phase shift circuit other than the mitigation circuit, a condition that the capacitor of the first mitigation circuit is larger than that of the digital phase shift circuit other than the mitigation circuit, and a condition that the pair of electronic switches of the first mitigation circuit are larger than those of the digital phase shift circuit other than the mitigation circuit, and
    wherein the second mitigation circuit satisfies at least one of a condition that a length of the second mitigation circuit is shorter than that of the digital phase shift circuit other than the mitigation circuit, a condition that a distance between the signal line and the inner line in the second mitigation circuit is longer than that in the digital phase shift circuit other than the mitigation circuit, a condition that a distance between the signal line and the outer line in the second mitigation circuit is shorter than that in the digital phase shift circuit other than the mitigation circuit, a condition that the capacitor of the second mitigation circuit is smaller than that of the digital phase shift circuit other than the mitigation circuit, and a condition that the pair of electronic switches of the second mitigation circuit are smaller than those of the digital phase shift circuit other than the mitigation circuit.

8. The digital phase shifter according to claim 1, wherein the digital phase shift circuit includes an electronic switch configured to switch between whether or not to connect the capacitor between the signal line and at least one of the first ground conductor and the second ground conductor.

9. The digital phase shifter according to claim 1, wherein the connection unit includes:
    a first connection line configured to connect the signal lines of the digital phase shift circuits located at ends of two digital phase shift circuit groups;
    a second connection line configured to connect the inner lines of the digital phase shift circuits located at ends of two digital phase shift circuit groups;
    a ground layer arranged in at least one of an upward direction and a downward direction of the first connection line and the second connection line; and
    a via-hole configured to connect at least the second connection line and the ground layer.

10. The digital phase shifter according to claim 9, wherein the connection unit includes a third connection line configured to connect the outer lines of the digital phase shift circuits located at outermost ends of two digital phase shift circuit groups.

* * * * *